(12) United States Patent
Shin

(10) Patent No.: US 7,813,197 B2
(45) Date of Patent: Oct. 12, 2010

(54) WRITE CIRCUIT OF MEMORY DEVICE

(75) Inventor: Beom-Ju Shin, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 161 days.

(21) Appl. No.: 12/027,068

(22) Filed: Feb. 6, 2008

(65) Prior Publication Data

US 2008/0137447 A1    Jun. 12, 2008

Related U.S. Application Data

(62) Division of application No. 11/476,562, filed on Jun. 29, 2006, now Pat. No. 7,345,930.

(30) Foreign Application Priority Data

Sep. 29, 2005  (KR) .................. 10-2005-0091549
Dec. 28, 2005  (KR) .................. 10-2005-0132643

(51) Int. Cl.
   *G11C 7/00* (2006.01)
(52) U.S. Cl. .................. 365/205; 365/207; 365/201; 365/189.07; 365/225.7
(58) Field of Classification Search .................. 365/205, 365/207, 225.7, 201, 189.07
   See application file for complete search history.

(56) References Cited

U.S. PATENT DOCUMENTS 5,640,115 A * 6/1997 Halepete et al. ............. 327/219
6,084,819 A    7/2000 Kablanian
6,163,491 A   12/2000 Iwamoto et al.
6,272,062 B1   8/2001 Mueller et al.
6,327,203 B1 * 12/2001 Won ........................... 365/205
6,771,117 B2 *  8/2004 Nakai ......................... 327/541

(Continued)

FOREIGN PATENT DOCUMENTS

CN         1519853         8/2004
KR   10-2006-0010197 A    2/2006

(Continued)

OTHER PUBLICATIONS

United State Office Action issued in U.S. Appl. No. 12/027,056 dated on Nov. 3, 2008.

(Continued)

*Primary Examiner*—Hoai V Ho
*Assistant Examiner*—Kretelia Graham
(74) *Attorney, Agent, or Firm*—IP & T Law Firm PLC

(57) ABSTRACT

A write circuit of a semiconductor memory device includes a global data input/output (I/O) line; an amplifying block for receiving and amplifying write data and transmitting the amplified write data as global data onto the global data I/O line; and a control block for comparing the write data with the global data to thereby disable the amplifying block when the write data and the global data have substantially the same data value.

4 Claims, 7 Drawing Sheets

U.S. PATENT DOCUMENTS 6,778,451 B2 8/2004 Takahashi et al.
6,816,416 B2 11/2004 Won
7,085,171 B2 8/2006 Song
7,240,253 B2 7/2007 Yoshida et al.

FOREIGN PATENT DOCUMENTS

TW 508587 11/2002
TW 556218 10/2003

OTHER PUBLICATIONS

Korean Office Action, issued in corresponding Korean Patent Application No. KR 10-2005-0132643, dated on Jun. 27, 2007.

Taiwanese Office Action, with English translation, issued in Taiwanese Patent Application No. TW 095123714, mailed Jan. 9, 2009.

* cited by examiner

WRITE CIRCUIT OF MEMORY DEVICE

RELATED APPLICATIONS

This application is a Divisional of U.S. application Ser. No. 11/476,562, filed Jun. 29, 2006, now U.S. Pat. No. 7,345,930 claiming priority of Korean Application Nos. 10-2005-0091549, filed Sep. 29, 2005, and 10-2005-0132643, filed Dec. 28, 2005, the entire contents of each of which are hereby incorporated by reference.

FIELD OF THE INVENTION

The present invention relates to a write circuit of a semiconductor memory device; and, more particularly, to a write circuit of a semiconductor memory device for reducing current consumption during a writing operation.

DESCRIPTION OF RELATED ARTS

For operating a semiconductor memory device at a high speed, it is required to not only improve an operational speed of a central processing unit (CPU) but also shorten an access time to the semiconductor memory device by reducing a waiting time of the CPU as much as possible.

In case of an asynchronous dynamic random access memory (DRAM), a delay time is needed for synchronizing a clock of the asynchronous DRAM with a system clock. Accordingly, to avoid the necessity of delay time, a synchronous dynamic random access memory (SDRAM), which operates in synchronization with the system clock, is preferred. The SDRAM has a short access time because the SDRAM does not require the delay time.

Generally, the SDRAM operates in response to a pulse signal generated in time of transition of the system clock. The SDRAM is classified into a single data rate (SDR) SDRAM and a double data rate (DDR) SDRAM according to a method for transitioning the system clock.

The SDR SDRAM generates a pulse signal in response to a rising edge of the system clock to thereby input or output data and commands in synchronization with the generated pulse signal. The DDR SDRAM generates a pulse signal in response to rising and falling edges of the system clock to thereby input or output data and command in synchronization with the generated pulse signal.

The DDR SDRAM is classified into a DDR1 SDRAM, a DDR2 SDRAM, and so on according to a kind of prefetch operation. The DDR SDRAM performs a 2-bit prefetch during a data input or output operation. The DDR2 SDRAM performs a 4-bit prefetch during a data input or output operation.

FIG. 1 is a block diagram showing a writing operation of a prior art SDRAM.

As shown, the SDRAM includes a data input/output pad (DQ_PAD) 10, a prefetch block 20, a data transferring block 30, an amplifying block (DIN IOSA) 40 and a global data input/output line 50.

During the writing operation of the SDRAM, the SDRAM receives input data via the DQ_PAD 10.

For the DDR1 SDRAM, two prefetch blocks 20 are required for prefetching the input data input via the DQ_PAD 10. For the DDR2 SDRAM, four prefetch blocks 20 are required for prefetching the input data input via the DQ_PAD 10. The DDR2 SDRAM is described in FIG. 1.

Referring to FIG. 1, during the writing operation of the DDR2 SDRAM, prefetched data A0 to A3 output from the prefetch block 20 are transferred to the amplifying block 40 via the data transferring block 30 as write data D0 to D3 according to a column address CA<1:0> and a burst type set by a mode register.

Table 1 is exemplary of the write data D0 to D3 transferred to the amplifying block 40 via the data transferring block 30 based on the column address CA<1:0> and the burst type. The burst type is classified into a sequential type and an interleave type.

TABLE 1

| Burst Type | CA<1:0> | D0 | D1 | D2 | D3 |
|---|---|---|---|---|---|
| Sequential | 00 | A0 | A1 | A2 | A3 |
|  | 01 | A1 | A2 | A3 | A0 |
|  | 10 | A2 | A3 | A0 | A1 |
|  | 11 | A3 | A0 | A1 | A2 |
| Interleave | 00 | A0 | A1 | A2 | A3 |
|  | 01 | A1 | A0 | A3 | A2 |
|  | 10 | A2 | A3 | A0 | A1 |
|  | 11 | A3 | A2 | A1 | A0 |

The amplifying block 40 is used as a data input/output sense amplifier so that the amplifying block 40 amplifies the write data D0 to D3 latched in response to the rising and falling edges of a data output signal DQS to output the amplified data to the global data input/output line 50. The data output signal DQS is applied during the write operation for synchronizing the input data. That is, the write data D0 to D3 is transformed from a DQS domain into a clock domain.

Referring to FIG. 1, during the write operation of the SDRAM, an enable signal for controlling the amplifying block 40 is a clock signal CLK. Accordingly, the amplifying block 40 always outputs the write data D0 to D3 as global data to the global data input/output line 50 in response to the rising and falling edges of the data output signal DQS without checking the global data at the global data input/output line 50.

As described above, the amplifying block 40 is always operating during the write operation of the SDRAM, to thereby consume an unnecessary current.

SUMMARY OF THE INVENTION

It is, therefore, an object of the present invention to provide a write circuit of a semiconductor memory device for reducing unnecessary current consumption by selectively performing a writing operation based on a comparison result of write data with global data of a global data I/O line within the semiconductor memory device.

In accordance with an aspect of the present invention, there is provided a write circuit of a semiconductor memory device, including: a global data input/output (I/O) line; an amplifying block for receiving and amplifying write data and transmitting the amplified write data as global data onto the global data I/O line; and a control block for comparing the write data with the global data to thereby disable the amplifying block when the write data and the global data have substantially the same data value.

In accordance with an aspect of the present invention, there is provided a semiconductor memory device for writing data, including: a global data input/output (I/O) line; a global latch block for latching global data of the global data I/O line; a prefetch block for receiving and prefetching an input data transmitted via a data pad and outputting the input data as prefetched data during a write operation; and a data transferring block for receiving the prefetched data and outputting the received data as write data in response to a column address and a burst type set by a mode register; a control block for generating an amplifying enable signal by comparing the write data with the global data of the global data I/O line; and an amplifying block for receiving and amplifying the write data and selectively transmitting the amplified write data as the global data onto the global data I/O line based on the amplifying enable signal.

In accordance with another aspect of the present invention, there is provided a method for driving a semiconductor memory device that includes an amplifying and driving device for receiving and amplifying write data and outputting the write data as global data to a global data input/output (I/O) line, including: comparing the write data with the global data; disabling the amplifying and driving device when the write data and the global data have the same data value; and enabling the amplifying and driving device when the write data and the global data have substantially different data values.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a write circuit of a semiconductor memory device in accordance with the present invention will be described in detail referring to the accompanying drawings.

Figure 1:
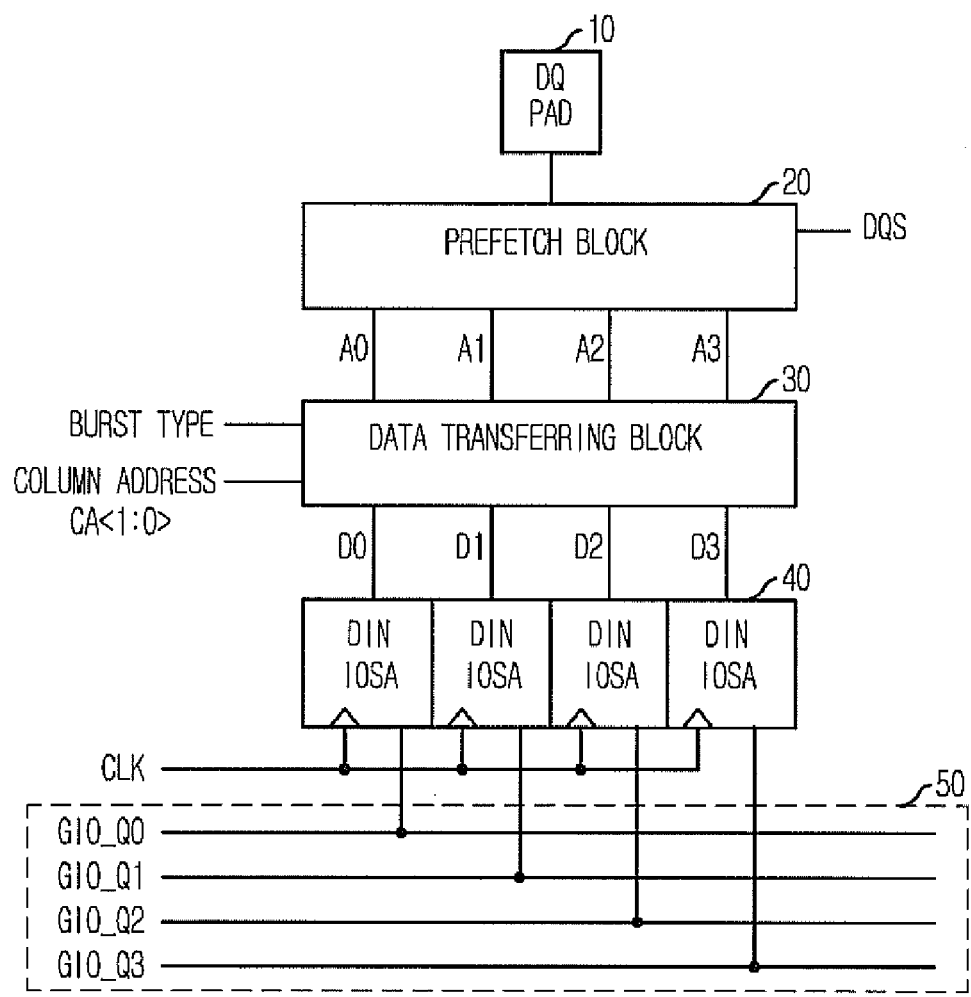
FIG. 1 is a block diagram for a prior art writing operation of a semiconductor memory device.
Figure 2:
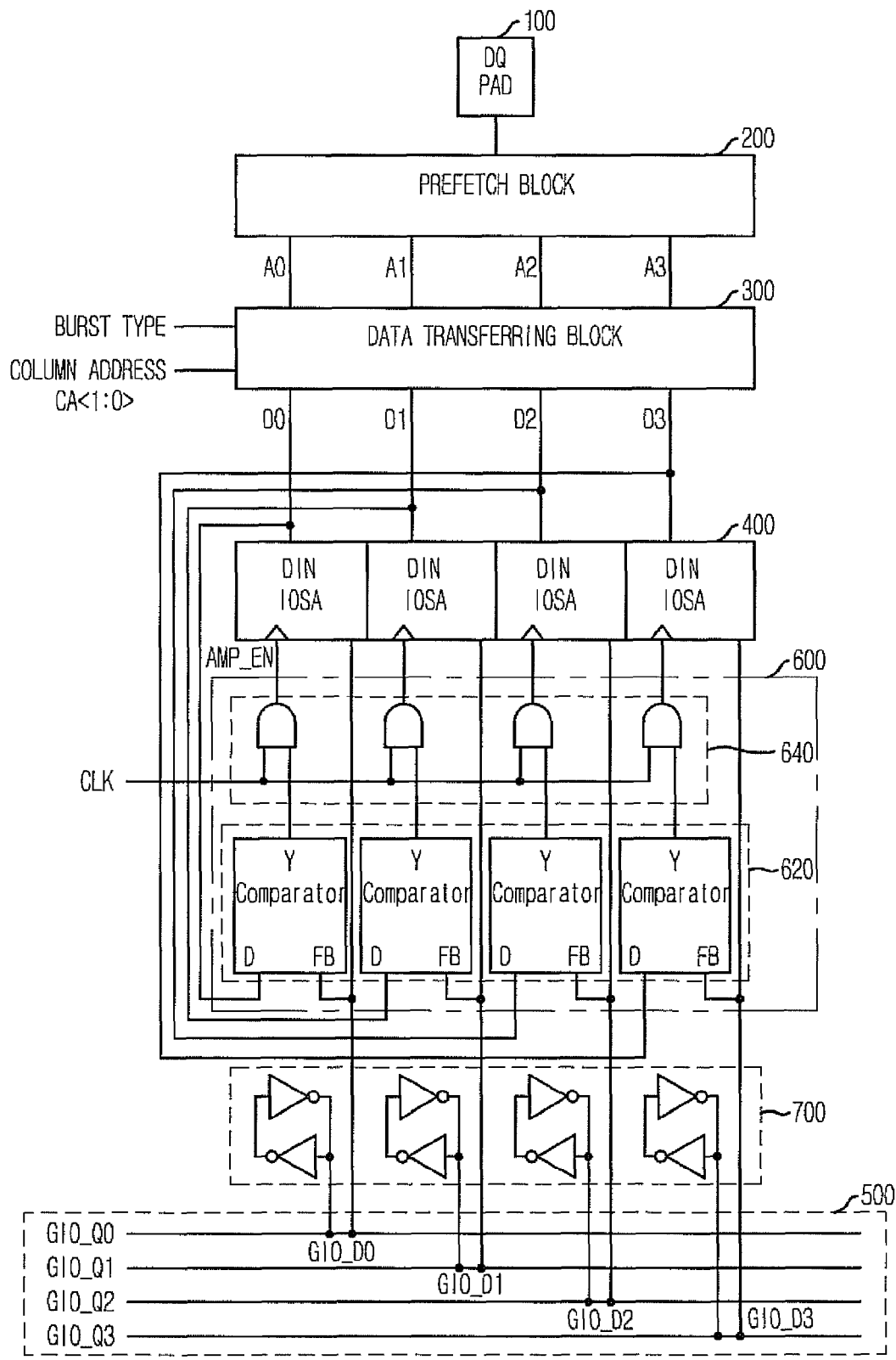
FIG. 2 is a block diagram for a writing operation of a semiconductor memory device in accordance with the present invention.

FIG. 2 is a block diagram for a writing operation of a semiconductor memory device in accordance with the present invention.

The semiconductor memory device in accordance with the present invention includes a data input/output pad (DQ PAD) 10, a prefetch block 200, a data transferring block 300, a data input amplifying block (DIN IOSA) 400, a global data input/output line 500, a control block 600 and a global latch block 700.

The prefetch block 200 receives and prefetches an input data input via the DQ PAD 100 to output the input data as a prefetch data A0 to A3.

The data transferring block 300 receives the prefetch data A0 to A3 output from the prefetch block 200 to output the received data as write data D0 to D3 to the data input amplifying block 400 in response to a column address CA<1:0> and a burst type, i.e., a sequential type or an interleave type, set by a mode register.

The data input amplifying block 400 receives and amplifies the write data D0 to D3 to output the amplified data as global data GIO_D0 to GIO_D3 to the global data I/O line 500, i.e., GIO_Q0 to GIO_Q3.

The control block 600 compares the write data D0 to D3 inputted to the data input amplifying block 400 with the global data GIO_D0 to GIO_D3 of the global data I/O line 500 to thereby disable the data input amplifying block 400 when the write data D0 to D3 and the global data GIO_D0 to GIO_D3 have the same data value.

The control block 600 includes a comparing block 620 and a signal generating block 640. The comparing block 620 compares the write data D0 to D3 with the global data GIO_D0 to GIO_D3, The signal generating block 640 generates an amplifying enable signal AMP_EN for enabling or disabling the data input amplifying block 400 by combining an output of the comparing block 620 and a clock signal CLK.

The global latch block 700 latches the global data GIO_D0 to GIO_D3 of the global data I/O line 500 to thereby prevent the global data I/O line 500 from floating.

Hereinafter, in accordance with various embodiments, a method for selectively driving the data input amplifying block 400 will be described.

For convenience of explanation, each component of the semiconductor memory device is described using basic units, e.g., a unit data input amplifying block 400A, a global data I/O line 500A, a unit control block 600A and a unit global latch block 700A.

Figure 3:
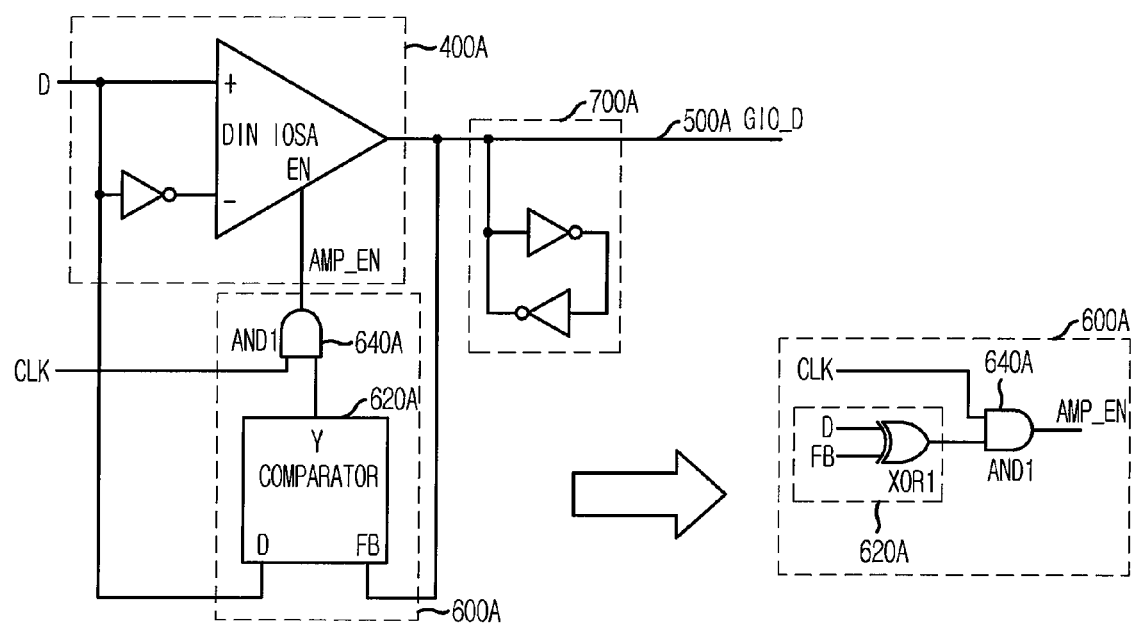
FIG. 3 is a block diagram of a semiconductor memory device for selectively driving a data input amplifying block in accordance with a first embodiment of the present invention.

FIG. 3 is a block diagram showing a semiconductor memory device for selectively driving the data input amplifying block 400 in accordance with a first embodiment of the present invention.

As shown, a unit data input amplifying block 400A amplifies write data D in response to an amplifying enable signal AMP_EN output from a unit control block 600A. A unit global latch block 700A latches an output of the unit data input amplifying block 400A to output the latched data to the corresponding global data I/O line 500A.

The unit control block 600A includes a unit comparing block 620A and a unit signal generating block 640A. The unit comparing block 620A compares the write data D with the global data GIO_D. The unit signal generating block 640A generates the amplifying enable signal AMP_EN for controlling the unit data input amplifying block 400A based on an output of the unit comparing block 620A and the clock signal CLK.

In particular, the unit comparing block 620A of the first embodiment of the present invention is always enabled. Referring to FIG. 3, the unit comparing block 620A includes an exclusive OR gate XOR1 which receives the write data D and the global data GIO_D to perform an exclusive OR operation therebetween. That is, the unit comparing block 620A outputs data with a logic level 'HIGH' only when the write data D and the global data GIO_D have a different data value.

In addition, the unit signal generating block 640A includes an AND gate AND1 that performs an AND operation of the output of the unit comparing block 620A and the clock signal CLK to output the result as the amplifying enable signal AMP_EN to the unit data input amplifying block 400A.

Figure 4:
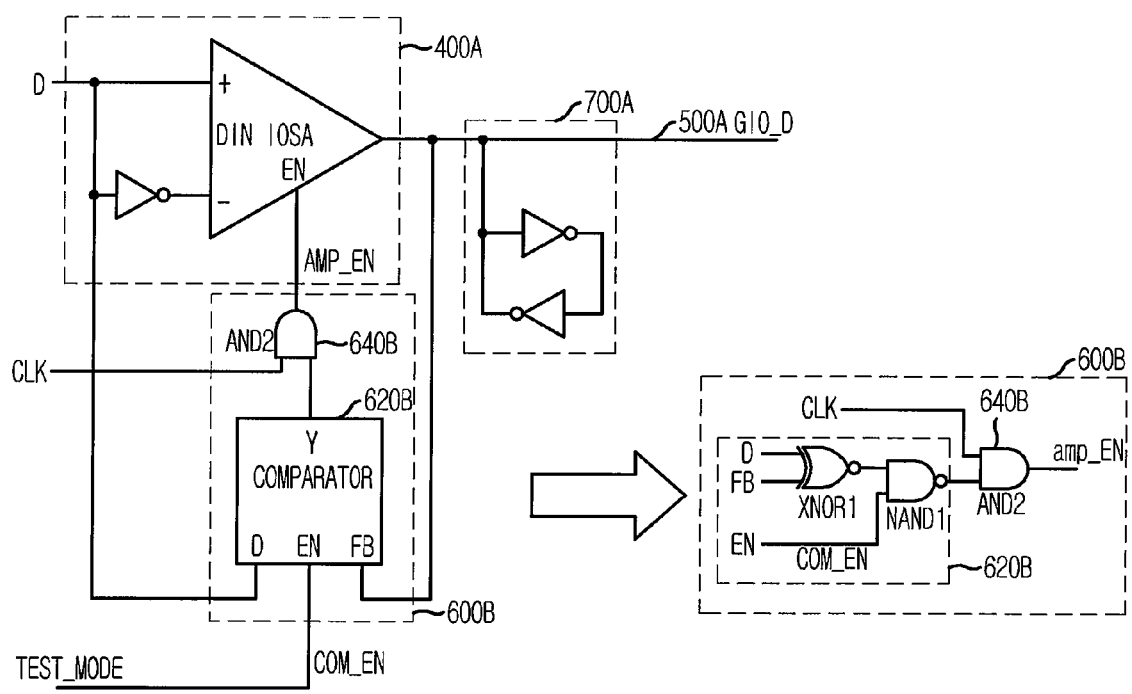
FIG. 4 is a block diagram of a semiconductor memory device for selectively driving a data input amplifying block based on a test mode signal in accordance with a second embodiment of the present invention.

FIG. 4 is a block diagram of a semiconductor memory device for selectively driving the data input amplifying block 400 based on a test mode signal in accordance with a second embodiment of the present invention.

As shown, the memory device of the second embodiment shown in FIG. 4 is similar to that of the first embodiment shown in FIG. 3, except that a unit comparing block 620B receives an external test mode signal TEST_MODE input as a comparison enable signal COM_EN so as to be selectively enabled based on the comparison enable signal COM_EN.

The unit comparing block 620B includes an exclusive NOR gate XNOR1 and a NAND gate NAND1. The exclusive NOR gate XNOR1 receives write data D and global data GIO_D to perform an exclusive NOR operation therebetween. The NAND gate NAND1 receives an output of the exclusive NOR gate XNOR1 and the comparison enable signal COM_EN to perform a NAND operation therebetween. As a result, if the comparison enable signal COM_EN is enabled, the unit comparing block 620B outputs data with a logic level 'HIGH' only when the write data D and the global data GIO_D have a different data value.

In addition, the unit signal generating block 640B includes an AND gate AND2 that performs an AND operation of the output of the unit comparing block 620B and the clock signal CLK to output it as the amplifying enable signal AMP_EN to the unit data input amplifying block 400A.

Figure 5:
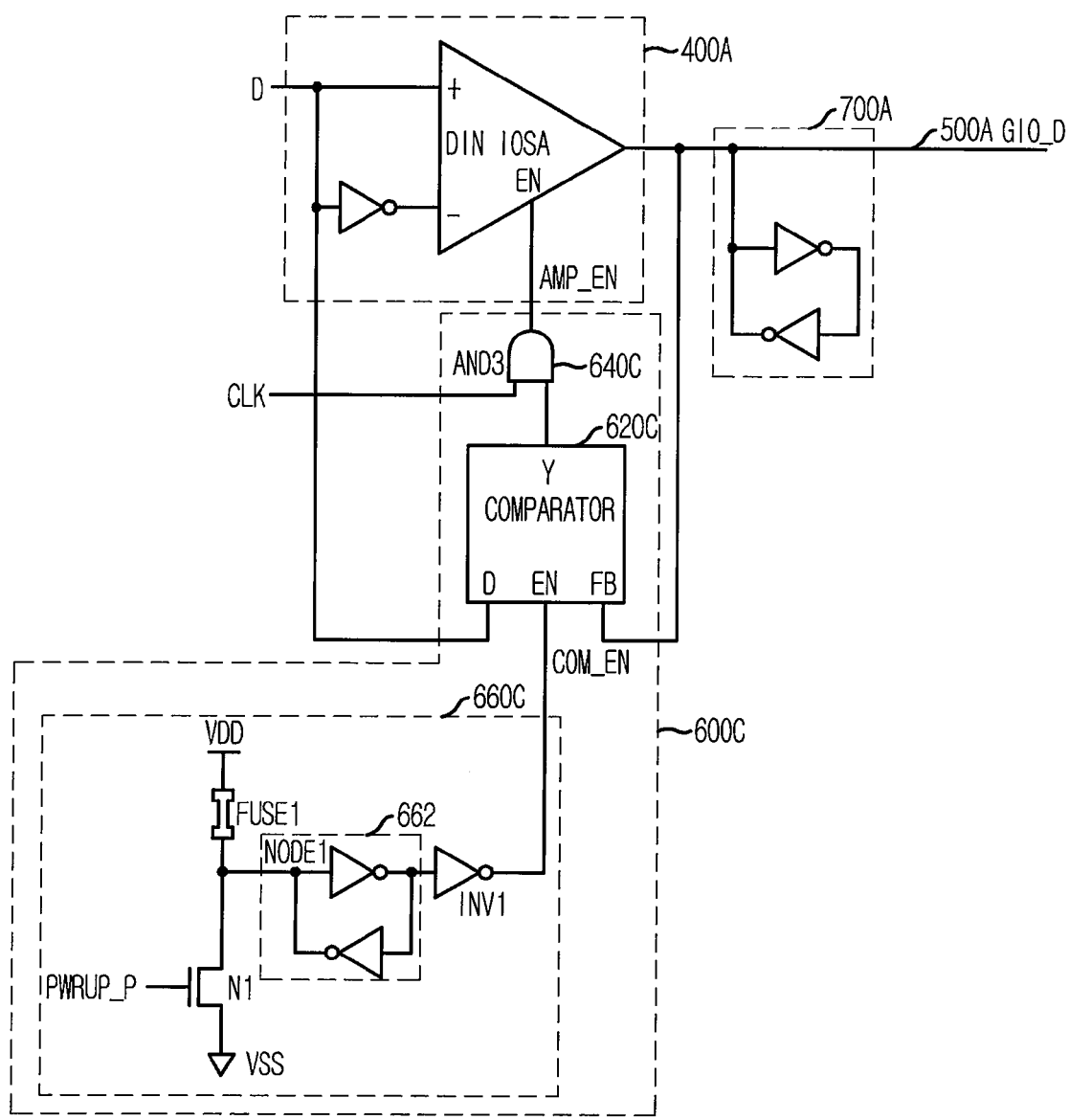
FIG. 5 is a block diagram of a semiconductor memory device for selectively driving a data input amplifying block based on a fuse option in accordance with a third embodiment of the present invention.

FIG. 5 is a block diagram of a semiconductor memory device for selectively driving the data input amplifying block 400 based on a fuse option in accordance with a third embodiment of the present invention.

As shown, the memory device of the third embodiment shown in FIG. 5 is similar to that of the second embodiment shown in FIG. 4, except that the comparison enable signal COM_EN for controlling a unit comparing block 620C is generated by a fuse option circuit 660C.

The fuse option circuit 660C for generating the comparison enable signal COM_EN includes an NMOS transistor N1, a fuse option FUSE1, a latch unit 662 and an inverter INV1.

The NMOS transistor N1 transfers a ground voltage VSS to a first node NODE1 in response to a power-up signal PWRUP_P inputted from external. The fuse option FUSE1 transfers a source voltage VDD to the first node NODE1. The latch unit 662 latches one of logic values of the ground voltage VSS transferred from the NMOS transistor N1 and the source voltage VDD transferred from the fuse option FUSE1. The inverter INV1 inverts an output of the latch unit 662 to output the latched signal as the comparison enable signal COM_EN to the unit comparing block 620C. As a result, if the comparison enable signal COM_EN is enabled by the fuse option FUSE1, the unit comparing block 620C outputs data with a logic level 'HIGH' only when the write data D and the global data GIO_D have a different data value.

The unit comparing block 620C has the same structure as that of the second embodiment and performs a logic operation of the write data D and the global data GIO_D based on the comparison enable signal COM_EN.

In addition, the unit signal generating block 640C includes an AND gate AND3 that performs an AND operation of the output of the unit comparing block 620C and the clock signal CLK to output it as the amplifying enable signal AMP_EN to the unit data input amplifying block 400A.

Figure 6:
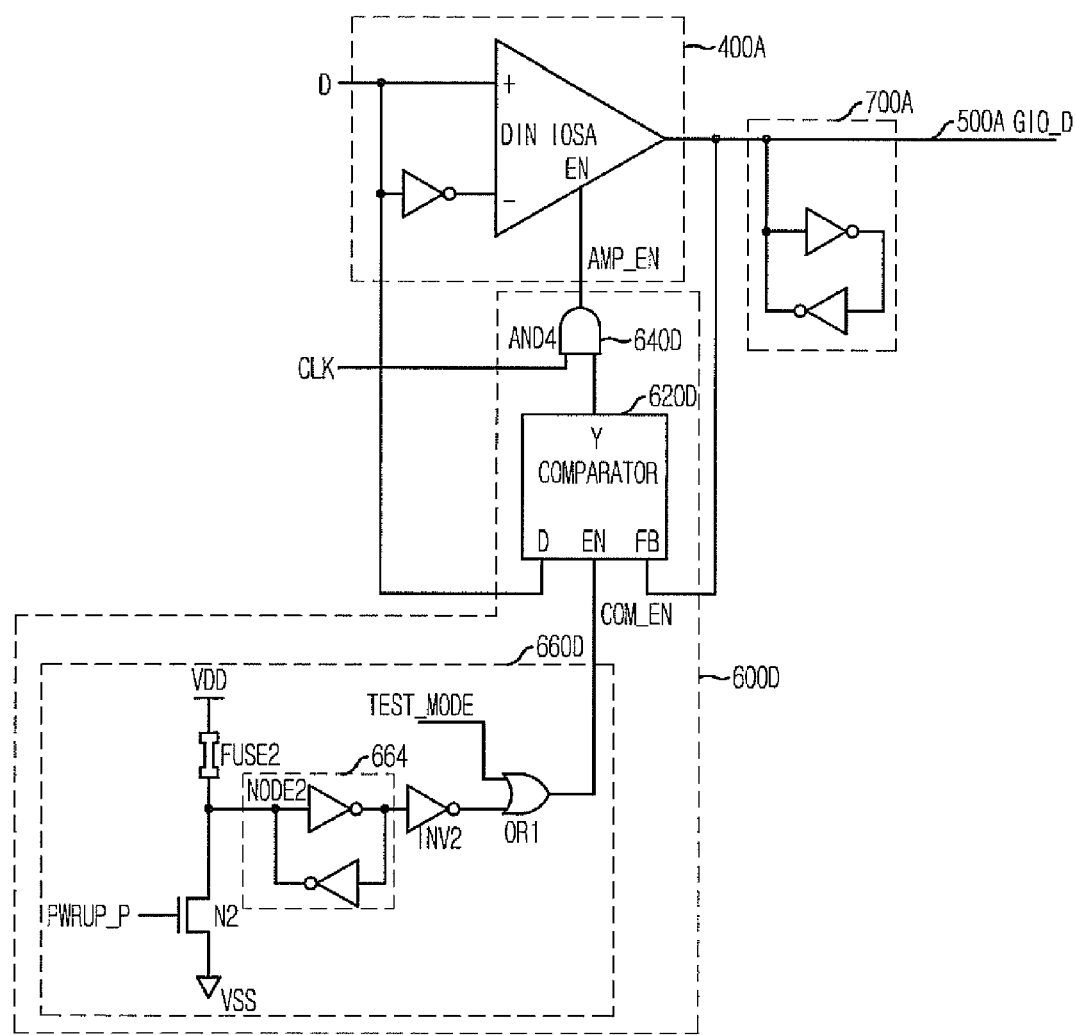
FIG. 6 is a block diagram of a semiconductor memory device for selectively driving a data input amplifying block by combining a test mode signal and a fuse option in accordance with a fourth embodiment of the present invention.

FIG. 6 is a block diagram of a semiconductor memory device for selectively driving the data input amplifying block 400 by combining a test mode signal and a fuse option in accordance with a fourth embodiment of the present invention.

As shown, the memory device of the fourth embodiment shown in FIG. 6 has a combined structure of the second and the third embodiments shown in FIGS. 3 and 4 so that the memory device of the fourth embodiment further comprises a comparison control unit 660D which generates the comparison enable signal COM_EN by combining the test mode signal TEST_MODE and the fuse option.

The comparison control unit 660D for generating the comparison enable signal COM_EN by combining the test mode signal TEST_MODE and the fuse option includes an NMOS transistor N2, a fuse option FUSE2, a latch unit 664, an inverter INV2, and an OR gate OR1.

The NMOS transistor N2 transfers a ground voltage VSS to a second node NODE2 in response to an external power-up signal PWRUP_P. The fuse option FUSE2 transfers a source voltage VDD to the second node NODE2. The latch unit 664 latches one of logic values of the ground voltage VSS transferred from the NMOS transistor N2 and the source voltage VDD transferred from the fuse option FUSE2. The inverter INV2 inverts an output of the latch unit 664. The OR gate OR1 performs an OR operation of the test mode signal TEST_ MODE and an output of the inverter INV2 to output the result signal as the comparison enable signal COM_EN to the unit comparing block 620D. As a result, if the comparison enable signal COM_EN is enabled by the fuse option FUSE2 or the test mode signal TEST_MODE, the unit comparing block 620D outputs data with a logic level 'HIGH' only when the write data D and the global data GIO_D have a different data value.

The unit comparing block 620D has the same structure as those of the second or the third embodiments and performs a logic operation of the write data D and the global data GIO_D based on the comparison enable signal COM_EN.

In addition, the unit signal generating block 640D includes an AND gate AND4 performs an AND operation of the output of the unit comparing block 620D and the clock signal CLK to output it as the amplifying enable signal AMP_EN to the unit data input amplifying block 400A.

Figure 7:
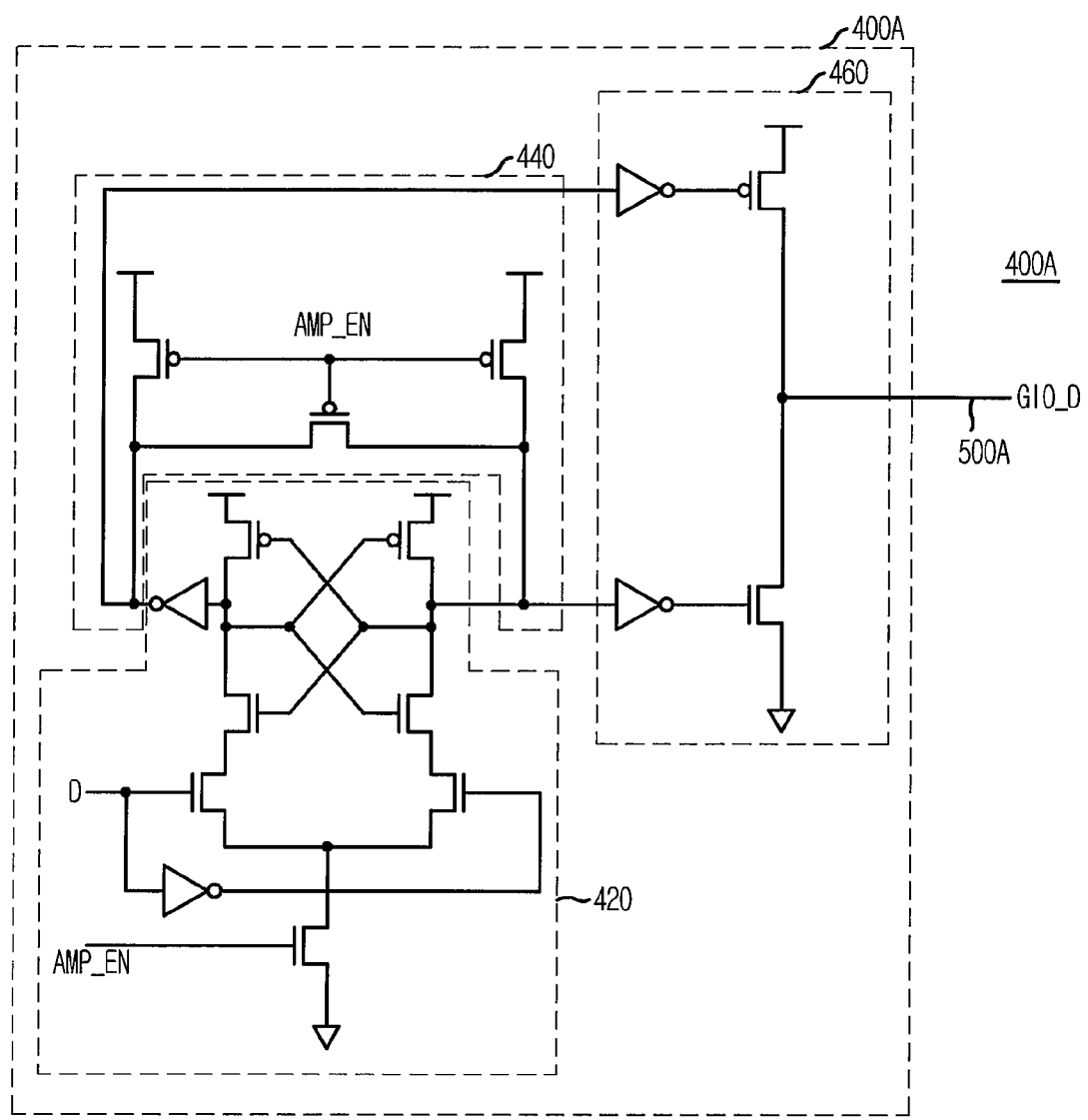
FIG. 7 is a detailed block diagram of a unit data input amplifying block shown in FIGS. 2 to 6.

FIG. 7 is a detailed block diagram of the unit data input amplifying block 400A shown in FIGS. 2 to 6.

The unit data input amplifying block 400A, enabled by the amplifying enable signal AMP_EN, amplifies the write data D to output the amplified data as the global data GIO_D to the corresponding global data I/O line 500A.

The unit data input amplifying block 400A includes a differential amplifying block 420, an enable block 440 and a driving block 460.

The differential amplifying block 420 senses and amplifies the write data D in response to the amplifying enable signal AMP_EN to output the amplified differential signals to the driving block 460.

The enable block 440 controls the differential amplifying block 420 in response to the amplifying enable signal AMP_EN.

The driving block 460 drives and outputs the amplified differential signals of the differential amplifying block 420 to the corresponding global data I/O line 500A.

Accordingly, in accordance with the present invention, the control block 600 compares the write data D with the global data GIO_D. If they have a different data value, the control block 600 enables and outputs the amplifying enable signal AMP_EN with a logic level 'HIGH' to the data input amplifying unit 400. As a result, the data input amplifying unit 400 performs the write operation. On the other hand, if they have the same data value, the control block 600 disables and outputs the amplifying enable signal AMP_EN with a logic level 'LOW' to the data input amplifying unit 400. As a result, the data input amplifying unit 400 does not perform the write operation thereby reducing unnecessary current consumption during the write operation.

As described above, in the prior art, when writing data to a global data I/O line, a data input/output sense amplifier is always enabled, regardless of global data of the global data I/O line, so that additional current is consumed because of an unnecessary operation of the data input/output sense amplifier.

On the other hand, in the present invention, it is possible to reduce unnecessary current consumption by selectively performing the writing operation based on the comparison result of the write data with the global data of a global data I/O line within the semiconductor memory device. The invention is even more effective for a device such as DDR2 SDRAM and DDR3 SDRAM whose prefetch operation is increased.

The present application contains subject matter related to Korean patent application Nos. 2005-91549 & 2005-132643, filed in the Korean Patent Office on Sep. 29, 2005 & Dec. 28, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A method for driving a semiconductor memory device that includes an amplifying and driving device for receiving and amplifying write data and outputting global data to a data line, comprising:
    comparing the write data with the global data based on a comparison enable signal which is activated in a test mode;
    disabling the amplifying and driving device when the write data and the global data have the same data value; and
    enabling the amplifying and driving device when the data values of the write data and the global data are substantially different from each other,
    wherein, according to a result of the comparison, one of the disabling and enabling of the amplifying and driving device is selected and the selected one is performed in synchronization with a clock signal.

2. The method for driving the semiconductor memory device as recited in claim 1, further comprising:
    prefetching input data transferred via a data pad to output prefetched data during a write operation; and
    receiving the prefetched data and outputting the received data as the write data in response to a column address and a burst type set by a mode register.

3. A method for driving a semiconductor memory device that includes an amplifying and driving device for receiving and amplifying write data and outputting global data to a data line, comprising:
    comparing the write data with the global data based on a comparison enable signal which is activated according to a fuse option;
    disabling the amplifying and driving device when the write data and the global data have the same data value; and
    enabling the amplifying and driving device when the data values of the write data and the global data are substantially different from each other,
    wherein, according to a result of the comparison, one of the disabling and enabling of the amplifying and driving device is selected and the selected one is performed in synchronization with a clock signal.

4. A method for driving a semiconductor memory device that includes an amplifying and driving device for receiving and amplifying write data and outputting global data to a data line, comprising:
    comparing the write data with the global data based on a comparison enable signal which is activated according to a fuse option in a test mode;
    disabling the amplifying and driving device when the write data and the global data have the same data value; and
    enabling the amplifying and driving device when the data values of the write data and the global data are substantially different from each other,
    wherein, according to a result of the comparison, one of the disabling and enabling of the amplifying and driving device is selected and the selected one is performed in synchronization with a clock signal.

* * * * *